United States Patent [19]
Gladfelter et al.

[11] Patent Number: 4,832,986
[45] Date of Patent: May 23, 1989

[54] PROCESS FOR METAL NITRIDE DEPOSITION

[75] Inventors: Wayne L. Gladfelter, St. Paul; Daniel R. Mantell, Minneapolis; John F. Evans, Minneapolis; Roland K. Schulze, Minneapolis, all of Minn.

[73] Assignee: Regents of the University of Minnesota, Minneapolis, Minn.

[21] Appl. No.: 69,714

[22] Filed: Jul. 6, 1987

[51] Int. Cl.[4] .............................................. C23C 16/34
[52] U.S. Cl. .................................... 427/248.1; 427/255
[58] Field of Search ...................... 427/248.1, 255, 314; 423/406, 409

[56] References Cited

U.S. PATENT DOCUMENTS

| | | | |
|---|---|---|---|
| 3,922,475 | 11/1975 | Manasevit | 428/701 |
| 4,446,242 | 5/1984 | Holt | 423/406 |
| 4,459,363 | 7/1984 | Holt | 423/406 |

OTHER PUBLICATIONS

L. E. Toth, in "Transition Metal Carbides and Nitrides," Academic Press, NY (1971).
L. V. Interrante et al., *Mats. Res. Soc. Symp. Proc.*, 73, 359 (1986).
M. I. Prince, *J. Organomet. Chem.*, 5, 584 (1966).
I. Haiduc et al., *Basic Organometallic Chem.*, de Gruyter, Berlin (1985) at pp. 97–107.
*McGraw-Hill Dictionary of Scientific and Technical Terms*, D. N. Lapides, ed., McGraw-Hill Book Co., NY (1974) at p. 947.

*Primary Examiner*—Sadie Childs
*Attorney, Agent, or Firm*—Merchant, Gould, Smith, Edell, Welter & Schmidt

[57] ABSTRACT

A method for forming metal nitride films is provided comprising employing the techniques of chemical vapor deposition to thermally decompose a vapor comprising a dialkyl(Group III metal) azide, so as to deposit a film of the corresponding metal nitride on the surface of a substrate.

6 Claims, 5 Drawing Sheets

Low Pressure Chemical Vapor Deposition Reactor

PROCESS FOR METAL NITRIDE DEPOSITION

BACKGROUND OF THE INVENTION

Methods for the deposition of thin films of solid state nitrides have been available for many years and are of interest for a variety of reasons. Among the nitrides of the Group III metals, aluminum nitride (AlN) has several potential applications. Its high melting point (2300° C.) and hardness (between $Al_2O_3$ and diamond), coupled with its large band gap (6.2 eV) make it a useful ceramic coating particularly for optical or optoelectronic devices. Its piezoelectric nature also renders it valuable for certain other applications. While not as robust as AlN, gallium nitride (GaN) and indium nitride (InN), both of which have the wurtzite structure analogous to AlN, have band gaps of 3.4 and 1.9 eV, respectively, which makes them of interest as semiconductors. There have been several reports describing the interesting properties of mixed compounds such as $Al_xGa_{1-x}N$.

By far the most common source of nitrogen for the preparation of nitrides is $N_2$ and $NH_3$. See L. E. Toth, in *Transition Method Carbides and Nitrides*, Academic Press, NY (1971). Because of the chemical inertness and/or the stability of these two species, high temperatures (1000° C. or greater) are usually required to form the nitride using chemical vapor deposition techniques (CVD). In a CVD process, organometallic precursors are volatilized and then decomposed to yield the metal nitride which is deposited as a film on the target substrate. For example, trimethylaluminum can be decomposed in the presence of ammonia to yield methane and aluminum nitride.

For AlN, lower deposition temperatures have recently been reported using the cyclic trimer, $[R_2AlNH_2]_3$ which is formed by the pyrolysis of the donor-acceptor complex $R_3Al-NH_3$. See L. V. Interrante et al., *Mats. Res. Soc. Symp. Proc.*, 73, 359 (1986). The chemical vapor deposition of both AlN and GaN has also been reported using hydrazine as the N-source. See D. K. Gaskill et al., *J. Crystal Growth*, 77, 418 (1986). Although these approaches have met with some success, a need exists for alternate nitrogen-containing precursors that will permit the use of substantially lower deposition temperatures in the CVD of nitride films.

BRIEF DESCRIPTION OF THE INVENTION

The present invention provides a method for applying a metal nitride film to the surface of a substrate comprising employing the techniques of chemical vapor deposition in conjunction with organometallic compounds of Group III elements which comprise the azide ($-N_3$) group as the nitrogen source. A vapor comprising an azide of the formula $[(C_1-C_5)alkyl]_2MN_3$, wherein M is a Group III metal, is thermally decomposed, so as to deposit a film of a metal nitride, MN, on said surface.

Preferably, the substrate is a material of use in the electronic industry, e.g., the MN film will function as a dielectric layer or as a diffusion barrier in a variety of microelectronic devices. For example, see K. L. Chopra et al., Thin Film Device Applications; Plenum, NY (1983) and E. Doering, in Insulating films in Semiconductors; J. F. Verweij et al., eds., Elsevier, Amsterdam (1985) at page 208. Therefore, useful substrates for MN film coating include silicon, platinum, tin oxide ($SnO_2$), aluminum oxide ($Al_2O_3$), gallium arsenide (GaAs) or glass.

Figure 1:
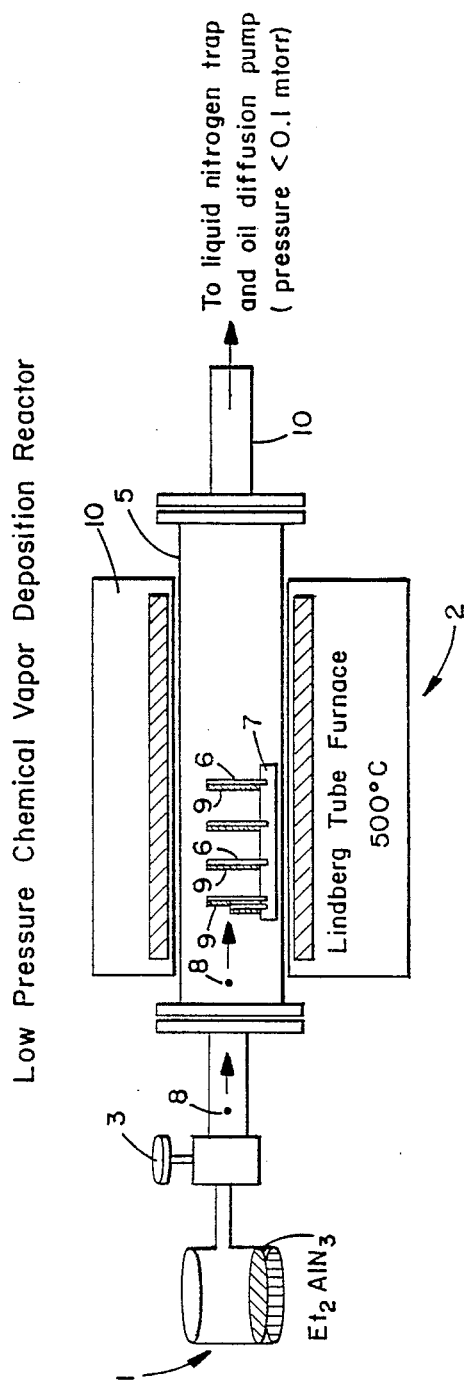
FIG. 1 is a schematic representation of the low pressure chemical vapor deposition reactor used for AlN depositions in accord with the present method.

As shown in FIG. 1, the CVD process will generally be carried out in a horizontal, low pressure CVD reactor (2). The axide precursor, e.g., $Et_2AlN_3$, contained in reservoir (1) at one end of the reactor is vaporized at about 25°–85° C. under a vacuum of no more than about $10^{-3}$ torr, e.g., at $10^{-7}$–$10^{-4}$ torr. The vaccum is provided by a suitable vacuum pump positioned at the opposite end of the reactor (not shown). A stream of an inert gas (He and/or Ar) can optionally be employed to vaporize the precursor, e.g., by passing it through a liquid precursor and into the reaction chamber. The azide vapor (8) then passes into a reaction chamber (5) which contains one or more units of the substrate (6). The substrate, e.g., wafers of silicon <100>, are preferably held in a vertical position by a suitable holder (7). The reaction chamber is maintained at a temperature, by means of an external furnace (10), which is effective to decompose the azide vapor (8) so as to deposit a film of a metal nitride, MN, (9) on the exposed surfaces of the substrate units. Preferably, the reaction chamber is maintained at about 400°–800° C. during the deposition process, most preferably at about 450°–700° C. Unreacted azide or volatile by-products then exit the chamber at exit port (10), and can be condensed in a liquid nitrogen trap (not shown).

Using the conditions described above, thin MN films of varying thicknesses can be prepared. For example, using $Et_2AlN_3$, reaction temperature of 480° C. and a system pressure of $\leq 1\times 10^{-4}$ torr, a four-hour deposition time generated a 0.4 μm film on Si(100). The rate of deposition was about 1000 Å/hr. Films of about 0.1–1.5 μm can readily be formed under these reaction conditions.

DETAILED DESCRIPTION OF THE INVENTION

Dialkylmetal Azides

The preferred precursors of the metal nitride films prepared in accord with the present method are di($C_1$–$C_5$)alkyl metal nitrides. Most preferably, a dialkyl nitride of a Group III metal will be used, e.g., of the general formula $[(C_1-C_5)alkyl]_2MN_3$ wherein M is aluminum, gallium or indium. Preferably the alkyl group will be methyl or ethyl, most preferably, ethyl.

These compounds can be prepared from readily available starting materials by known synthetic methods. Diethylaluminum azide has been prepared by the reaction of sodium azide with $Et_2AlCl$ by M. I. Prince et al., *J. Organomet. Chem.*, 5, 584 (1966), the disclosure of which is incorporated by reference herein.

However, even relatively weak acids are capable of cleaving the M-C bond in trialkyl metal complexes. [See I. Haiduc et al., *Basic Organometallic Chemistry*, de Gruyter, Berlin (1985)]. By carefully controlling the stoichiometry, and the rate of addition, hydrazoic acid could be used to form the azides. This reaction (eq. 1) would have the advantage of forming completely halide-free products.

$$MR_3 + HN_3 \rightarrow R_2MN_3 + H-R \quad (1)$$

$$R_2MH + HN_3 \rightarrow R_2MN_3 + H_2 \quad (2)$$

Reaction 2 illustrates another mild route that makes use of hydrazoic acid. Other routes involving more exotic reagents such as $ClN_3$ are known and can be used if necessary. (See J. Muller et al., *J. Organomet. Chem.*, 12, 37 (1968)). Trialkyl(Group III metal) compounds ($MR_3$) are commercially available and include trimethylaluminum, trimethylgallium, trimethylindium, triethylaluminum, triethylgallium and triethylindium (Alfa Products, Danvers, MA). Dialkyl metal azides, such as $Et_2AlN_3$, are known to exist as cyclic trimers in the liquid state, but will be represented as monomers ($R_2MN_3$) herein for ease of depiction.

It is believed that a ($C_1$–$C_5$) (Group III metal) azide thermally decomposes to yield a (Group III metal) nitride film as shown in the reaction (eq. 3), below, for $Et_2AlN_3$.

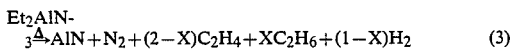

$$Et_2AlN_3 \xrightarrow{\Delta} AlN + N_2 + (2-X)C_2H_4 + XC_2H_6 + (1-X)H_2 \quad (3)$$

Based on the relative amounts of $C_2H_4$ and $C_2H_6$ detected by IR and mass spectrometry, the value of X is about 0.3

Substrates

The present method is described primarily by reference to examples involving the deposition of metal nitride films on Si(100) surfaces. However, it is expected that the surfaces of other crystal plane orientations of silicon and/or other substrates can be effectively coated with a film of a Group (III) metal nitride by the present method, for a variety of end-uses, as discussed hereinabove. Such substrates include, but are not limited to, Si<311>, Si<III>, Si<110>, GaAs<110>, GaAs<III>, GaAs<311>, $SnO_2$, $Al_2O_3$ and various $SiO_2$ glasses.

The invention will be further described by reference to the following detailed examples, wherein diethylaluminum chloride and sodium azide were purchased from Aldrich Chemical Company, Milwaukee, WI. The sodium azide was carefully ground and placed in a vacuum to dry for two days. The diethylaluminum azide was prepared by the procedure of M. I. Prince et al., *J. Organomet. Chem.*, 5, 584 (1966), the disclosure of which is incorporated by reference herein.

All reactions were performed under an atmosphere of purified nitrogen. Benzene was purified by shaking with concentrated sulfuric acid until the washings were colorless, washed with water, saturated aqueous sodium bicarbonate and saturated aqueous sodium chrloride. It was then dried with sodium sulfate, and distilled under nitrogen from calcium hydride.

Infrared (IR) spectra were obtained either on a Mattson Cygnus 25 or Sirius 100 spectrophotometer equipped with HgCdTe detectors. NMR spectra were obtained on an IBM NR-200 AF instrument using dried benzene-$d_6$ as the solvent. Mass spectra were obtained on a VG 7070E-HF spectrometer. X-ray diffraction data were obtained on a Siemens D500 diffractometer using graphite monochromatized Cu $K_\alpha$ radiation and scintillation detection. Alignment was determined using the Si<400> reflection. All film thickness measurements were performed on a Tencor alpha step stylus profilometer.

The structure of the surface of the CVD AlN films were examined by optical microscopy using an Olympus BH microscope utilizing Nomarski interference contrast optics. Magnification was possible from 100× to 500×. The microscopic surface structure of the films was examined by electron microscopy using a JEOL 840II Scanning Electron Microscope with a Tracor Northern TN-5500 EDS system for doing the energy dispersive X-ray analysis.

Example I. Chemical Vapor Deposition (CVD) of Aluminum Nitride (AlN)

Except as noted below in the example describing X-ray photoelectron spectroscpy (XPS) studies, all depositions were conducted in an all-glass, horizontal tube, low pressure CVD reactor. FIG. 1 shows a schematic of the system. The reactor tube (5) can be isolated and removed from the system (2) and placed directly into a Vacuum Atmosperes glove box. This allows coated and uncoated substrate samples to be handled and stored under an inert atmosphere. During a deposition, the temperature of the precursor was maintained (typically at 40° C.) using a constant temperature water bath (not shown). The pressure of the system was maintained with a triple-stage oil diffusion pump and was estimated to be $\leq 1 \times 10^{-4}$ torr. A single-stage furnace (10) was used to heat the 26 mm o.d. pyrex tube (5) which contained the substrate (6). A typical deposition was conducted at 480°–550° C.

The substrate consisted of Si<100> cut into approximately 1 cm squares. These were cleaned by sequentially rinsing them in tetrachloroethylene, ethanol, deionized water, dilute HF, and deionized water. After air-drying the substrates, they were placed in a Macor ceramic holder (7) to hold them in a vertical position during the deposition. The distance between adjacent wafers was 6 mm. Masking of the wafers was achieved by placing two wafers in direct contact with one another.

After placing the substrate into the reactor, it was heated from 200°–480° C. under vacuum to remove adsorbed water. When the temperature was stabilized at 480° C., the valve (3) was opened to connect the reaction chamber to the flask (1) containing the precursor. As the reaction proceeded, the material was deposited on the tube wall and ceramic holder as well as the Si wafers. The deposition zone, which was approximately 20 cm in length, began about 5 cm into the heated region. all the diethylaluminum azide was decomposed in the hot zone of the reactor. No alkyl aluminum compounds were observed in the liquid nitrogen cooled trap located after the reactor. At the end of the deposition, byproduct gases were analyzed by high resolution mass spectrometry and infrared spectroscopy. Ethene was the major organic product observed along with minor amounts of ethane. When the deposition was conducted in the antechamber of the XP system described below, hydrogen was observed as a reaction byproduct using the system's residual gas analyzer. Under the standard deposition conditions described, AlN films were prepared ranging in thickness from 0.1 to 1.3 μm. As an example, a deposition time of 4 hr generated a 0.4 μm film. The rate of deposition was about 1000 Å/hr.

Example II. X-Ray Photoelectron Spectroscopy (XPS)

All XPS surrace analysis was performed on a Physical Electronics division of Perkin Elmer model 555 surface analysis system. The double pass cylindrical mirror electron energy analyzer was operated in the retarding mode for constant resolution. The excitation source was Mg $K_\alpha$ or Al $K_\alpha$ radiation. Any sputter etching of the sample done during the surface analysis was done with 5 KV aragon (Ar) ions.

In the direct transfer experiments, the AlN deposition was done in a reactor appended directly to the ultra-high vacuum (UHV) surface analysis chamber so that sample transfers and film surface analysis could be performed without exposing the sample to the atmosphere. The base pressure of the reactor was $2 \times 10^{-5}$ torr with the major contaminant being water. Prior to performing the CVD, at least three freeze-pump-thaw cycles were carried out on the diethylaluminum azide to a pressure of $4 \times 10^{-5}$ torr to remove dissolved gases.

During the AlN deposition, the azide precursor dosing vessel was maintained at 80° C. to provide a sufficient vapor pressure of the diethylaluminum azide. The dosing lines leading to the reactor were also heated to minimize condensation within those lines. The deposition was done in a flow-through mode where the precursor vapor was pumped through the reactor vessel. The azide pressure in the reactor during the deposition ranged from sub-millitorr levels to 10 millitorr for different experiments. AlN was deposited onto tin oxide, platinum, or single crystal silicon by resistively heating these substrates to 550° C. The reaction times were greater than 45 min to insure growth of a film thick enough to exhibit bulk properties. Annealing of the AlN subsequent to the deposition took place in UHV at this same temperature.

In the axide dosing experiments, the diethylaluminum azide was condensed onto a clean, gold substrate held at 77° K. in the reaction chamber, and then transferred to the UHV chamber for XPS analysis.

XPS Analysis of the Films

Figure 2:
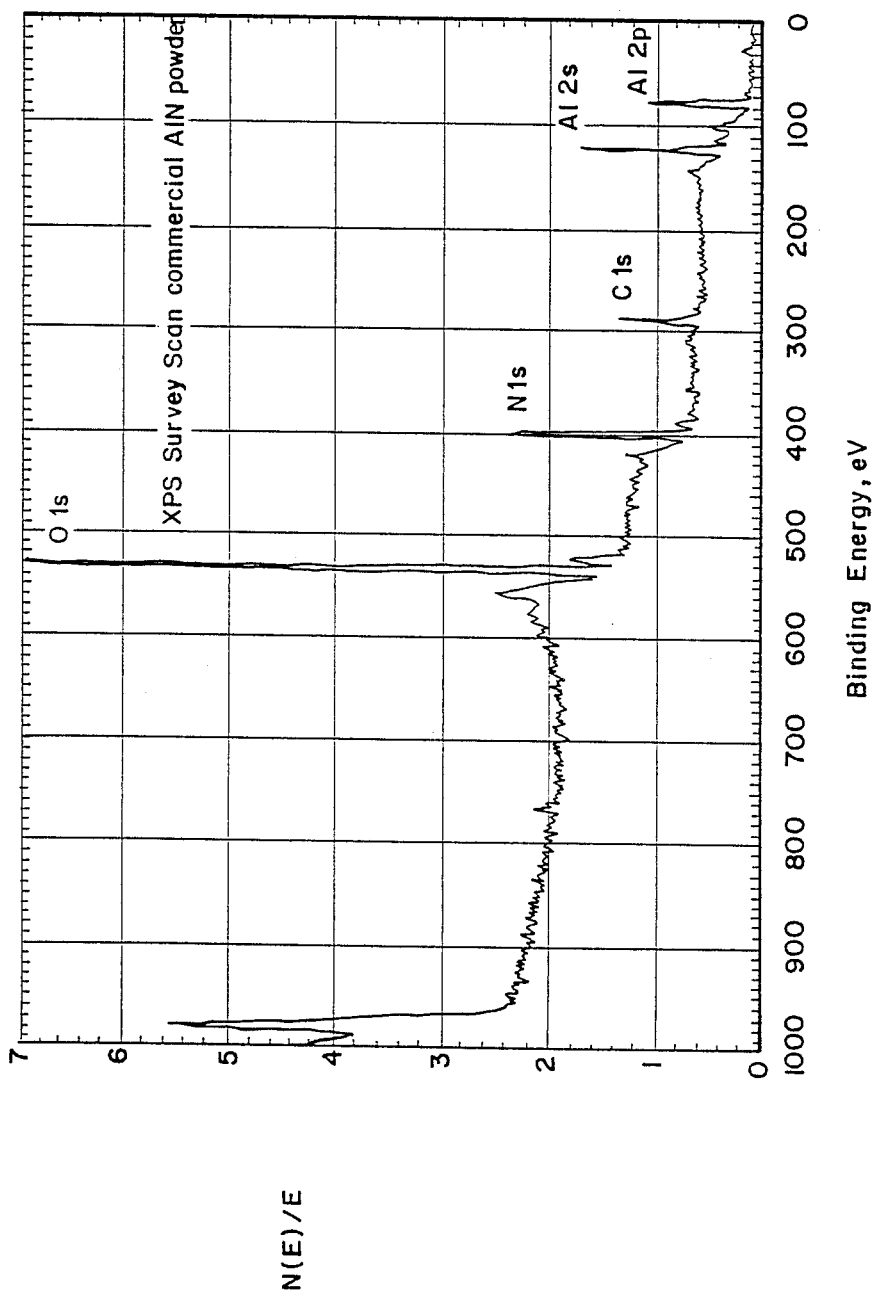
FIG. 2 depicts the X-ray photoelectron spectrum of AlN powder adsorbed on tape.

We studied the elemental composition of the thin AlN films using X-ray photoelectron spectroscopy (XPS). This technique also gave us some important information regarding the chemical state of the elements. FIG. 2 shows the surface XPS of a powdered sample of commercially available AlN. The most prominent feature is the O(1s) peak located at 531.5 eV. The size of the peak relative to the other elements, especially Al, suggests that there is oxygen or water adsorbed on the surface. The C(1s) peak at 284.6 eV is as intense as the N(1s) peak at 396.7 eV. An X-ray powder diffraction scan of the AlN powder was in good agreement with the ASTM tables. See Powder Diffraction File, International Center for Diffraction Data, Swarthmore, PA, at Card #25-1133. The only detectable impurity was a small amount of Al metal itself. The spectrum is typical of samples of AlN that are exposed to the atmosphere for several days. In all of the samples prepared in the low pressure CVD reactor, this surface coverage could be removed by argon sputtering to a point where Al and N were the predominant atoms observed. The oxygen impurity, however, was always present.

Figure 3:
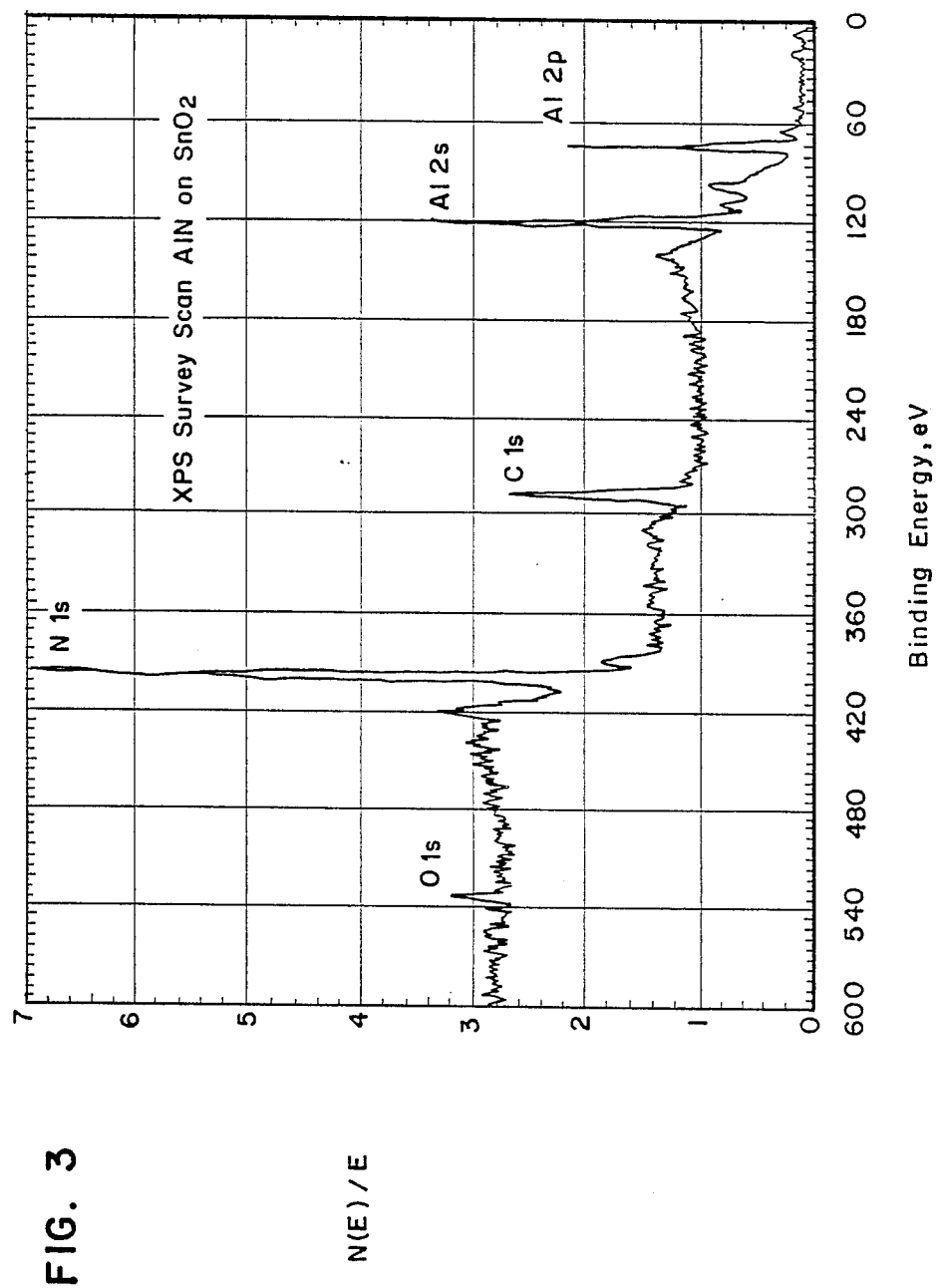
FIG. 3 depicts the X-ray photoelectron spectrum of a thin film of AlN deposited in the antechamber of the X-ray photoelectron spectrometer (XPS) using $Et_2AlN_3$.

In order to minimize the problem of oxygen contamination, we conducted several depositions of AlN (using $Et_2AlN_3$) directly in the antechamber of the XPS spectrometer. The system offered two important advantages, the base pressure in the antechamber was about $10^{-5}$ torr (lower than the pressure in the low pressure CVD reactor), and the sample could be moved directly into the UHV chamber for analysis without exposure to the atmosphere. The films obtained were superior to films prepared in the CVD reactor as demonstrated by the data summarized in FIG. 3. This particular deposition was conducted on tin oxide at 500°–550° C. for about one hour. No peaks due to the substrate can be seen, and the prominent peaks are due to Al and N. The two impurities on the surface prior to sputtering are oxygen (about 2 atomic percent) and carbon (23%). This scan also indicates tht the N/Al ratio is 1.3. When Ar ion sputtering is used to remove the topmost Å of the surface, the oxygen level drops to about 1% whereas most of the carton is removed. Further sputtering decreases the carbon to a very small but observable peak, and does little to change the oxygen content. At this stage the N/Al ratio is 1.0.

Figure 4:
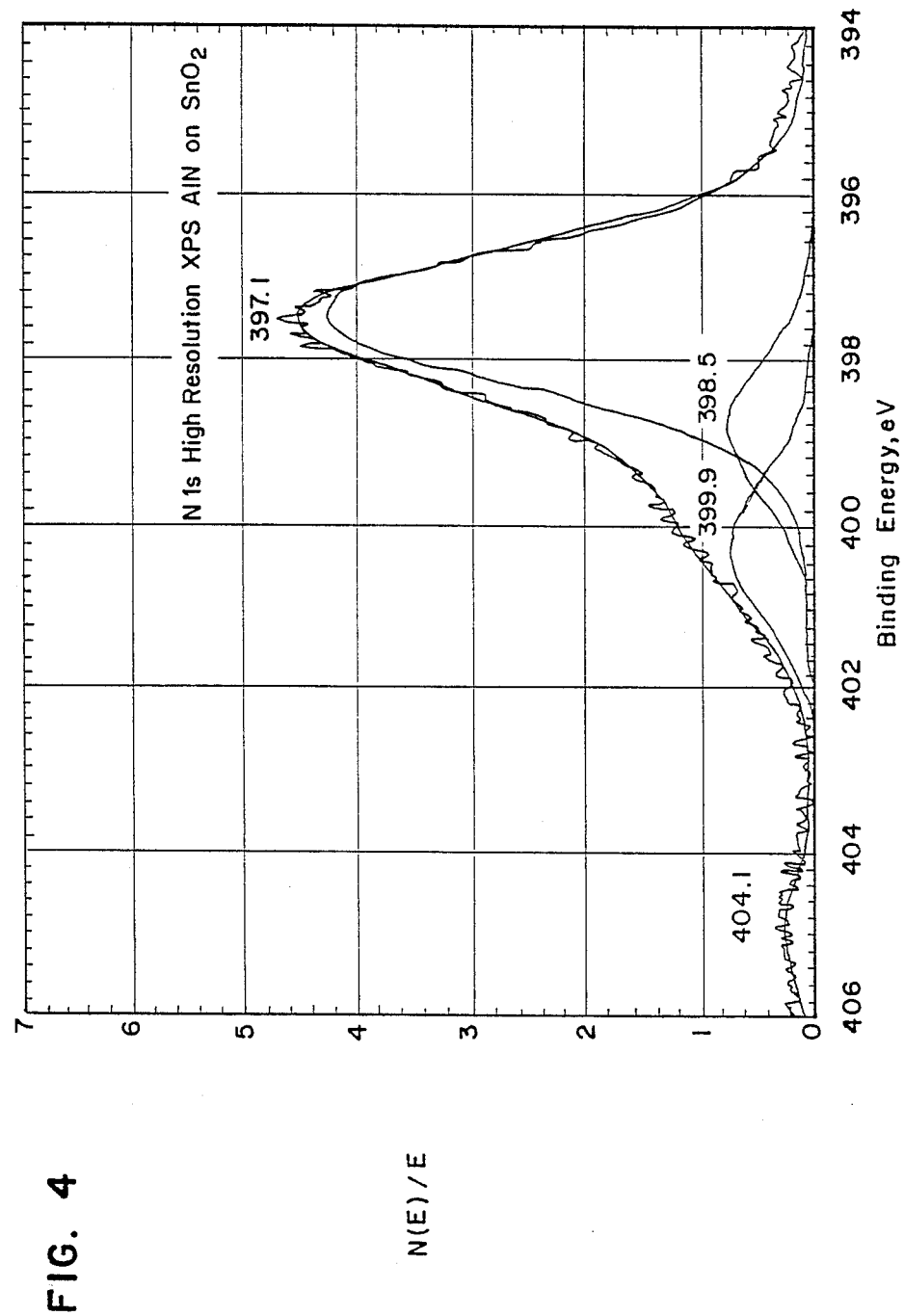
FIG. 4 depicts the high resolution XPS scan of the nitrogen (N) 1s region of the AlN thin film. This is the same sample analyzed in FIG. 3.

High resolution XPS scans made prior to sputtering revealed relatively symmetric, although slightly broad, peaks for O, Al, and C. Nitrogen, however, gave a much more complex pattern as shown in FIG. 4, along with the result of the curve-fitting procedure. The large peak at low energy (397.1 eV) is characteristic of AlN. The three high energy peaks located at 398.5, 399.9, and 404.1 eV are proposed to arise from residual, unreacted azide bound to the film.

Figure 5:
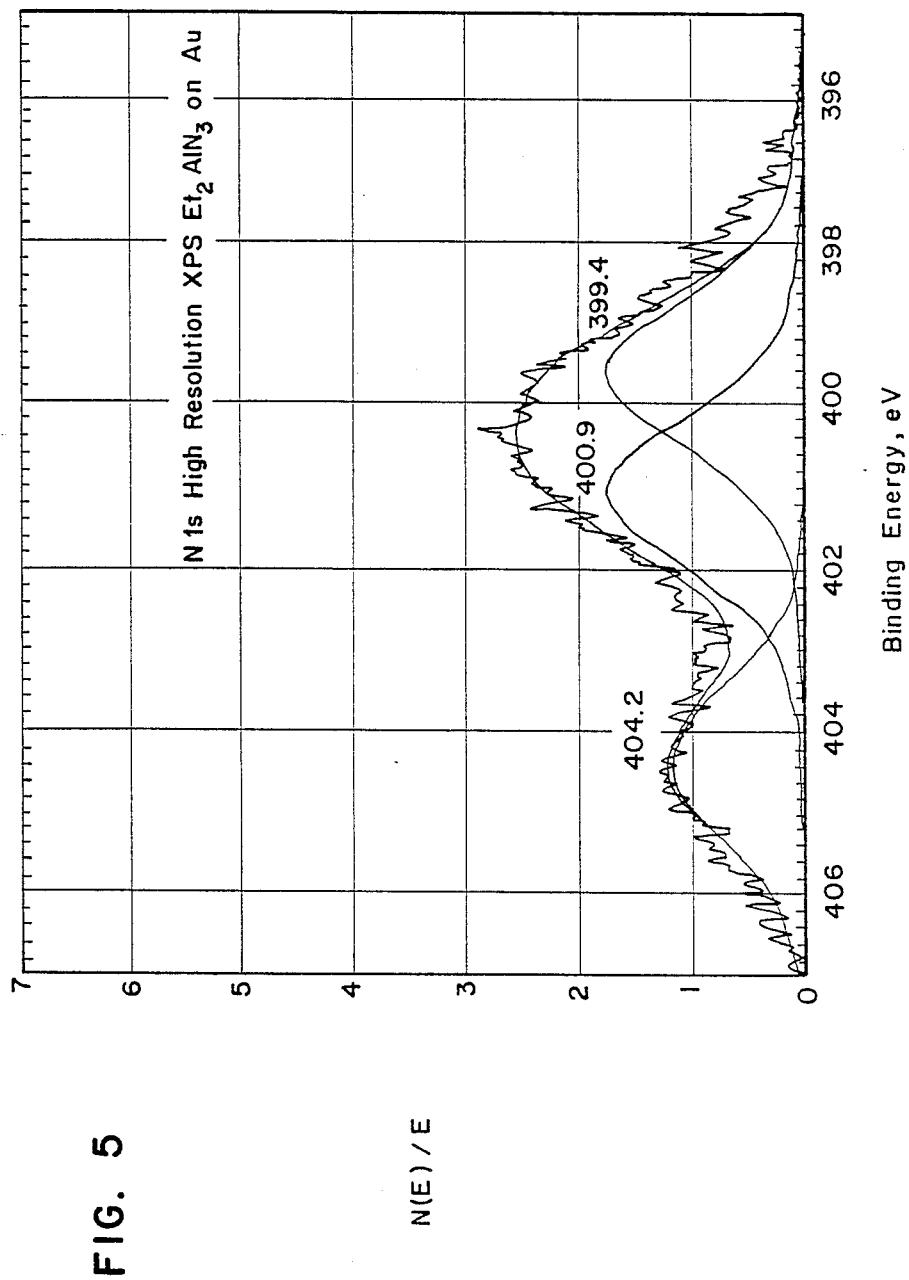
FIG. 5 depicts a high resolution XPS scan of the N 1s region of $Et_2AlN_3$ adsorbed on a gold (Au) probe at 77° K.

In a separate experiment, we deposited the $Et_2AlN_3$ on an Au surface cooled to 77° K. The C and Al peaks were symmetric with full-width-half-maximum (fwhm) values of 3.0 eV. FIG. 5 shows the two distinct bands observed for the nitrogen. The larger band at lower energy was curve fit to two peaks and these are assigned to the two terminal nitrogens of the azide. (Curve fitting the data with a constant fwhm value among all peaks suggested that two distinct chemical states of nitrogen give peaks at 399.4 and 400.9 eV). This would be expected from the proposed structure of $Et_2AlN_3$ which has only one of the terminal nitrogens bound to the Al. The high energy peak (404.2 eV) is assigned to the most electron difficient nitrogen at the center of the azide group. The similarity in chemical shifts of the three high energy peaks found on the AlN deposited using $Et_2AlN_3$ with those observed in the precursor itself strongly suggest some azide is still present in the film. In subsequent experiments with films deposited in the antechamber of the spectrometer, the residual azide were always observed. Annealing these films at 550° C. under UHV conditions did remove all detectable traces of the azide, giving one symmetric nitrogen peak at 397.1 eV as expected for AlN.

Infrared Spectroscopy of the Films

For AlN films deposited on silicon wafers, transmission infrared spectral measurements were possible. All of the samples of AlN gave a broad absorption having a maximum at 700 $cm^{-1}$. This compares favorably with other reports of AlN films prepared by alternative methods. [L. Xinjiao et al., *Thin Solid Films*, 139, 261 (1986)].

X-Ray Diffraction by the Films

Many of the films were examined by X-ray powder diffraction. The only peak observed was a very broad feature centered at 34° C. in two-theta. Annealing the film at 1000° C. for several hours did not significantly change the peak. The three most intense reflections from polycrystalline AlN appear betwween 33° C. and 36° C. The lack of any identifiable peaks due to AlN suggests that the sample is basically amorphous. The broad peak may be due to the presence of very small crystallites within an amorphous matrix.

Optical and Electron Microscopy

The thin films were examined using both optical and electron microscopy. The optical microscope was fitted with Nomarski optics which are useful for examining small changes in relief of the sample by setting up interference patterns between two polarized rays reflected from the surface. Most of the AlN films were remarkably flat. Some depositions gave flaky-looking films that adhered poorly to the substrate. A correlation was observed between the length of time the substrate spent in the HF wash and the appearance of flakes. In many cases, the edge of the flakes would be parallel to one another and intersect others at right angles. The electron microscopy also gave pictures showing a flat surface. Most of the area was observed to be featureless.

The invention has been described with reference to various specific and preferred embodiments and techniques. However, it should be understood that many variations and modifications may be made while remaining within the spirit and scope of the invention.

What is claimed is:

1. A method for applying a metal nitride film to the surface of a substrate comprising employing the techniques of chemical vapor deposition to thermally decompose a vapor comprising an azide of the formula $[(C_1-C_5)alkyl]_2MN_3$, wherein M is a Group III metal, so as to deposit a film of a metal nitride, MN, wherein M is the Group III metal, on said surface.

2. The method of claim 1 wherein M is Al, Ga or In.

3. The method of claim 2 where in the azide is $(C_1-C_5)_2 AlN_3$.

4. The method of claim 1 wherein the azide is decomposed at about 400°–800° C., at a pressure of no more than about $10^{-3}$ torr.

5. The method of claim 1 wherein the substrate comprises silicon, platinum, $SnO_2$, glass, $Al_2O_3$ or GaAs.

6. The method of claim 1 wherein said azide vapor is formed by evaporating a liquid or solid azide at a temperature of about 25°–85° C. at a pressure of no more than about $10^{-3}$ torr.

* * * * *